(12) United States Patent
Aybay et al.

(10) Patent No.: US 7,916,472 B1
(45) Date of Patent: Mar. 29, 2011

(54) COOLING SYSTEM FOR A DATA PROCESSING UNIT

(75) Inventors: Gunes Aybay, Los Altos, CA (US); David J. Lima, Los Altos, CA (US); Olaf Moeller, Santa Clara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 12/858,250

(22) Filed: Aug. 17, 2010

Related U.S. Application Data

(63) Continuation of application No. 12/341,580, filed on Dec. 22, 2008, now Pat. No. 7,804,684.

(51) Int. Cl.
G06F 1/20 (2006.01)
H05K 7/20 (2006.01)
H05K 5/00 (2006.01)

(52) U.S. Cl. ........... 361/679.5; 361/679.48; 361/679.49; 361/694; 361/695; 361/720; 361/721; 312/236; 454/184

(58) Field of Classification Search ............. 361/679.46, 361/679.48–679.5, 690, 692–695, 715–716, 361/720–721; 165/80.2–80.3; 174/16.1; 312/223.2, 236; 454/184
See application file for complete search history.

(56) References Cited

U.S. PATENT DOCUMENTS

| | | | |
|---|---|---|---|
| 3,895,215 A | 7/1975 | Gordon | |
| 5,663,868 A | 9/1997 | Stalley | |
| 5,751,549 A | 5/1998 | Eberhardt et al. | |
| 6,280,318 B1 | 8/2001 | Criss-Puszkiewicz et al. | |
| 6,452,797 B1 | 9/2002 | Konstad | |
| 6,462,948 B1 | 10/2002 | Leija et al. | |
| 6,603,662 B1 | 8/2003 | Ganrot | |
| 6,628,520 B2 | 9/2003 | Patel et al. | |
| 6,721,180 B2 | 4/2004 | Le et al. | |
| 6,755,242 B2 | 6/2004 | White | |
| 6,778,386 B2 * | 8/2004 | Garnett et al. | 361/679.48 |
| 6,876,549 B2 | 4/2005 | Beitelmal et al. | |
| 6,879,486 B1 | 4/2005 | Banton et al. | |
| 6,900,387 B2 | 5/2005 | Gravell et al. | |
| 6,904,968 B2 | 6/2005 | Beitelmal et al. | |
| 6,912,131 B2 * | 6/2005 | Kabat | 361/720 |

(Continued)

OTHER PUBLICATIONS electronic design, "Optimized Interconnect Eliminates Limits in Orthogonal Architectures" [online] [retrieved on Nov. 5, 2008] Retrieved from the Internet: <URL: http://electronicdesign.com/Articles/Print.cfm?AD=1&ArticleID=13277>, (10 pgs).

(Continued)

*Primary Examiner* — Robert J Hoffberg
(74) *Attorney, Agent, or Firm* — Cooley LLP

(57) ABSTRACT

A data processing unit includes a chassis configured to contain a line card. The chassis defines, at least in part, a portion of a first flow pathway and a portion of a second flow pathway. The chassis is configured such that a first portion of a gas can flow within the first flow pathway between an intake region and the first end portion of the line card such that the first portion of the gas flows across a first end portion of the line card in a first direction. The chassis is configured such that a second portion of the gas can flow within the second flow pathway between the intake region and a second end portion of the line card such that the second portion of the gas flows across the second end portion of the line card in a second direction opposite the first direction.

20 Claims, 10 Drawing Sheets

U.S. PATENT DOCUMENTS

| | | |
|---|---|---|
| 7,088,583 B2 | 8/2006 | Brandon et al. |
| 7,151,229 B2 | 12/2006 | Mueller |
| 7,158,379 B2 | 1/2007 | Sanders et al. |
| 7,245,632 B2 | 7/2007 | Heffernan et al. |
| 7,280,356 B2 | 10/2007 | Pfahnl et al. |
| 7,434,412 B1 | 10/2008 | Miyahira |
| 7,548,421 B2 | 6/2009 | Malone et al. |
| 7,804,684 B1 * | 9/2010 | Aybay et al. ............... 361/679.5 |
| 7,808,792 B2 * | 10/2010 | Nguyen ........................ 361/721 |
| 7,813,120 B2 * | 10/2010 | Vinson et al. .............. 361/679.5 |
| 2005/0180103 A1 | 8/2005 | Ku |
| 2007/0153462 A1 | 7/2007 | Crippen et al. |
| 2008/0225479 A1 | 9/2008 | Zieman et al. |
| 2009/0059520 A1 | 3/2009 | Tanaka et al. |
| 2009/0109612 A1 | 4/2009 | Moss et al. |
| 2009/0122484 A1 | 5/2009 | Caveney |
| 2010/0002382 A1 | 1/2010 | Aybay et al. |

OTHER PUBLICATIONS electronic design, "Optimized Interconnect Eliminates Limits in Orthogonal Architectures" [online] [retrieved on Nov. 5, 2008] Retrieved from the Internet: <URL: http://electronicdesign.com/Articles/Print.cfm?AD=l&ArticleID=13277>, (10 pgs).

David Lima et al. "Air Flow Ducts for Cooling Electronic Devices Within A Data Processing Unit" U.S. Appl. No. 12/695,509 filed Jan. 28, 2010, 35 pages.

* cited by examiner

COOLING SYSTEM FOR A DATA PROCESSING UNIT

CROSS-REFERENCE TO RELATED APPLICATIONS

This application is a continuation of U.S. application Ser. No. 12/341,580, entitled "Cooling System for a Data Processing Unit," filed Dec. 22, 2008, now U.S. Pat. No. 7,804,684 which is incorporated herein by reference in its entirety.

BACKGROUND

This invention relates to electronic data processing units, and more particularly, to apparatus and methods for cooling a data processing unit.

Some known data processing units include multiple circuit boards configured to process and/or transmit electrical signals. Such known data processing units can include, for example, routers, switches, servers, storage devices, and/or components included within a core switch fabric of a data center. Such known data processing units include cooling systems configured to prevent overheating of the electronic circuits (e.g., the modules) included on the circuit boards contained therein. Some known cooling systems are configured to convey cooling air across the surface of the circuit boards in a single direction (e.g., from a first side to a second side). In such an arrangement, however, the electronic circuits disposed on or adjacent the second side of the circuit board are exposed to cooling air that has been heated as a result of flowing across the electronic circuits disposed on or adjacent the first side of the circuit board. Similarly stated, with such cooling systems, the electronic circuits located downstream receive cooling air having a higher temperature than that of the cooling air received by the electronic circuits located upstream.

Some known data processing units use an orthogonal midplane configuration, in which a first set of circuit boards (e.g., line cards) is coupled to the front side of a midplane in a vertical configuration and a second set of circuit boards (e.g., line cards) is coupled to the rear side of the midplane in a horizontal configuration. The orthogonal midplane configuration allows each line card from the first (i.e., front) set of line cards to be directly connected to each line card from the second (i.e., rear) set of line cards, thus eliminating the use of printed circuit board signal traces on the midplane to convey the signals between the cards. The cooling systems of known data processing units having an orthogonal midplane configuration often cool the rear set of line cards by diverting air flow from cooling channels in the front part of the chassis that are used to cool the front set of line cards. This arrangement, however, limits the degree to which the rear set of line cards can be cooled independently from the front set of line cards. Additionally, this arrangement can result in the cooling air supplied to the rear set of line cards having a higher temperature than the cooling air supplied to the front set of line cards.

Thus, a need exists for improved apparatus and methods for cooling the components (e.g., the line cards) within a data processing unit having an orthogonal midplane configuration.

SUMMARY

Data processing units are described herein. In some embodiments, a data processing unit includes a chassis configured to contain a line card. The line card has a first end portion and a second end portion that is mutually exclusive of the first end portion. The chassis defines, at least in part, a portion of a first flow pathway and a portion of a second flow pathway. The chassis is configured such that a first portion of a gas can flow within the first flow pathway between a region outside of the chassis and the first end portion of the line card such that the first portion of the gas flows across the first end portion of the line card in a first direction. The chassis is configured such that a second portion of the gas can flow within the second flow pathway between the region outside of the chassis and the second end portion of the line card such that the second portion of the gas flows across the second end portion of the line card in a second direction. The second direction is opposite the first direction.

DETAILED DESCRIPTION

Figure 1:
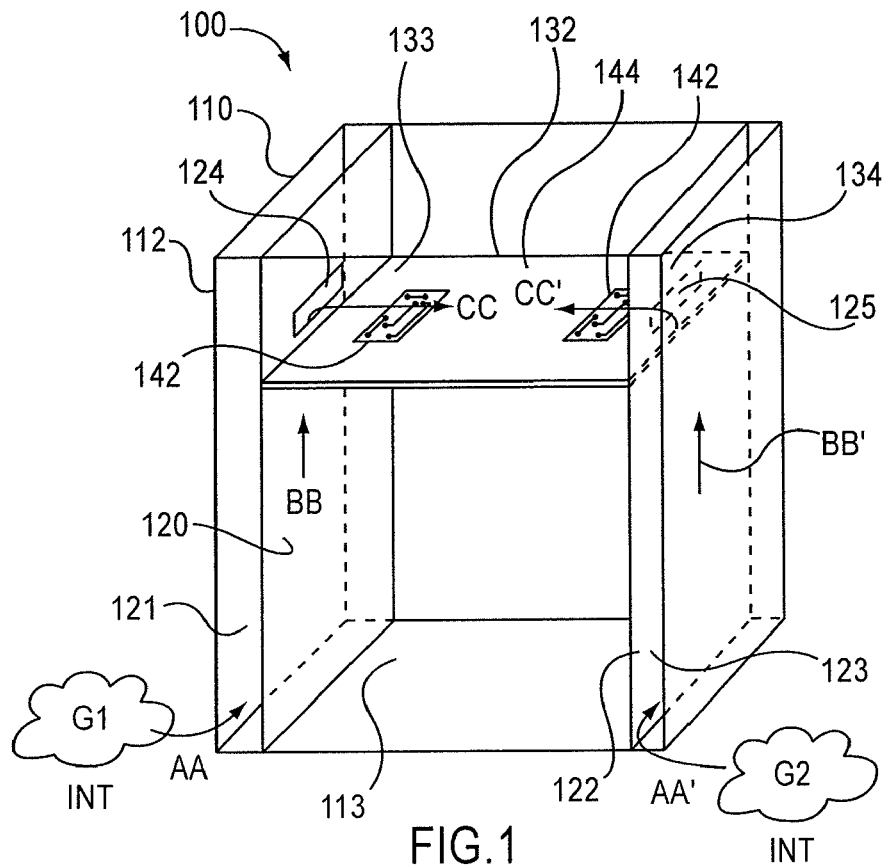
FIG. 1 is a perspective view schematic illustration of a data processing unit according to an embodiment.

Data processing units are described herein. In some embodiments, a data processing unit includes a chassis configured to contain a line card. The line card has a first end portion and a second end portion that is mutually exclusive of the first end portion. The chassis defines, at least in part, a portion of a first flow pathway and a portion of a second flow pathway. The portion of the chassis defining the first flow pathway is configured such that a first portion of a gas can flow within the first flow pathway between a region outside of the chassis and the first end portion of the line card such that the first portion of the gas flows across the first end portion of the line card in a first direction. The portion of the chassis defining the second flow pathway is configured such that a second portion of the gas can flow within the second flow pathway between the region outside of the chassis and the second end portion of the line card such that the second portion of the gas flows across the second end portion of the line card in a second direction. The second direction is opposite the first direction.

In some embodiments, a data processing unit includes a chassis configured to contain a line card. The line card has a first end portion, a second end portion and a central portion between the first end portion and the second end portion. The chassis defines, at least in part, a portion of a first flow pathway, a portion of a second flow pathway and a portion of a third flow pathway. The portion of the chassis defining the first flow pathway is configured such that a first portion of a gas can flow within the first flow pathway between an intake region exterior to the chassis and the first end portion of the line card. The portion of the chassis defining the second flow pathway is configured such that a second portion of the gas can flow within the second flow pathway between the intake region and the second end portion of the line card. The portion of the chassis defining the third flow pathway is configured such that the first portion of the gas and the second portion of the gas can flow within the third flow pathway between a location proximate the central portion of the line card and an exhaust region exterior to the chassis.

In some embodiments, a data processing unit includes a chassis and a line card. In some embodiments, the data processing unit can include one or more sets of line cards. The line card is disposed within an interior region of the chassis. The chassis defines, at least in part, a portion of a first flow pathway. The chassis is configured such that a gas can flow within the first flow pathway between a first region exterior to the chassis and the interior region of the chassis, and across a surface of the line card in a first direction substantially parallel to the surface of the line card. The chassis and the line card collectively define a portion of a second flow pathway, which can be, for example, an exhaust flow pathway. The chassis and the line card are collectively configured such that the gas can flow within a portion of the second flow pathway in a second direction between the interior region of the chassis and a second region exterior to the chassis. The second direction is substantially orthogonal to the surface of the line card. The second region exterior to the chassis can be, for example, an exhaust region at the rear portion of the chassis.

In some embodiments, an apparatus includes a line card configured to be disposed within a chassis of a data processing unit. The line card has a surface upon which an electronic circuit can be mounted. The electronic circuit can be, for example, any suitable electronic component, communications module or the like. The line card defines a flow path such that a gas can flow substantially orthogonal to the surface of the line card when the line card is disposed within the chassis. In some embodiments, for example, the line card can define a plurality of holes through which the gas can flow when the line card is disposed within the chassis.

As used herein the term "data processing unit" refers to any computer, electronic switch, router or the like used to process, transmit and/or convey electronic signals. A data processing unit can include, for example, a component included within an electronic communications network. In some embodiments, for example, a data processing unit can be a component included within a core switch fabric of a data center. In other embodiments, a data processing unit can be an access switch located at an edge of a data center or a host device (e.g., a server) coupled to the access device. For example, an access switch can be located on top of a chassis containing several host devices.

The term "parallel" is used herein to describe a relationship between two geometric constructions (e.g., two lines, two planes, a line and a plane, two curved surfaces, a line and a curved surface or the like) in which the two geometric constructions are substantially non-intersecting as they extend substantially to infinity. For example, as used herein, a planar surface (i.e., a two-dimensional surface) is said to be parallel to a line when every point along the line is spaced apart from the nearest portion of the surface by a substantially equal distance. Two geometric constructions are described herein as being "parallel" or "substantially parallel" to each other when they are nominally parallel to each other, such as for example, when they are parallel to each other within a tolerance. Such tolerances can include, for example, manufacturing tolerances, measurement tolerances or the like.

The terms "perpendicular," "orthogonal," and/or "normal" are used herein to describe a relationship between two geometric constructions (e.g., two lines, two planes, a line and a plane, two curved surfaces, a line and a curved surface or the like) in which the two geometric constructions intersect at an angle of approximately 90 degrees within at least one plane. For example, as used herein, a line is said to be normal to a curved surface when the line and the curved surface intersect at an angle of approximately 90 degrees within a plane proximate to where the line and the curved surface intersect. Two geometric constructions are described herein as being "orthogonal" or "substantially orthogonal" to each other when they are nominally orthogonal to each other, such as for example, when they are orthogonal to each other within a tolerance. Such tolerances can include, for example, manufacturing tolerances, measurement tolerances or the like.

It should be understood that the references to geometric constructions are for purposes of discussion and illustration. The actual structures may differ from geometric ideal due to tolerances and/or other minor deviations from the geometric ideal.

FIG. 1 is a perspective schematic illustration of a data processing unit 100 according to an embodiment. The data processing unit 100 includes a chassis 110 and a line card 132. Although not shown in FIG. 1, the chassis 110 can also contain additional components associated with the operation of the data processing unit 100. Such additional components can include, for example, power supplies, data transmission cables, cooling fans, and/or the like. The chassis 110 includes an external enclosure or side wall 112 that defines an internal region 113 of the chassis 110 within which the line card 132 is disposed. Although the front and top portions of the external side wall 112 are shown in FIG. 1 as being transparent for purposes of illustration, the external side wall 112 substantially surrounds and/or encloses the internal region 113 of the chassis 110. In other embodiments, however, the external side wall 112 can surround only a portion of the internal region 113 of the chassis 110.

The chassis 110 includes a first internal side wall 120 and a second internal side wall 122. In some embodiments, the first internal side wall 120 and/or the second internal side wall 122 can be structural members that include coupling portions (not shown), such as clips, brackets, slots, or the like, configured to retain and/or support the line card 132 and/or any other components housed within the chassis 110. In other embodiments, the first internal side wall 120 and/or the second internal side wall 122 can be non-structural members, such as, for example, thin sheet steel, plastic or the like. Although the first internal side wall 120 and the second internal side wall 122 are shown as being substantially planar, in other embodiments, the first internal side wall 120 and the second internal side wall 122 can have any suitable shape or relative orientation. As described in more detail herein, the external side wall 112 and the first internal side wall 120 collectively define a first flow pathway 121. The external side wall 112 and the second internal side wall 122 collectively define a second flow pathway 123.

The line card 132 can be any suitable circuit card that can process, transmit and/or convey electronic and/or optical signals. For example, in some embodiments, the line card 132 can include a printed circuit board populated with one or more electronic circuits (e.g., modules, chips, integrated circuit packages, etc.) configured to perform the functions of the data processing unit 100. In some embodiments, for example, the line card 132 can be configured to convert optical signals to and from electrical signals. In some embodiments, the line card 132 can be configured to transmit multiple signals associated with one or more data streams to and from other line cards and/or other data processing units (not shown in FIG. 1) within a communications network.

The line card 132 has a first end portion 133, a second end portion 134 and a surface 144. The second end portion 134 of the line card 132 is spaced apart from the first end portion 133 of the line card 132. Similarly stated, the second end portion 134 of the line card 132 is mutually exclusive of the first end portion 133 of the line card 132. The first end portion 133 of the line card 132 is coupled to the first internal side wall 120. The second end portion 134 of the line card 132 is coupled to the second internal side wall 122. The surface 144 of the line card 132 includes a set of electrical circuits 142. The electrical circuits 142 can be, for example, any printed circuit module or other suitable component for performing the data processing functions of the line card 132.

As described above, the external side wall 112 and the first internal side wall 120 collectively define a first flow pathway 121. The external side wall 112 and the second internal side wall 122 collectively define a second flow pathway 123. Similarly stated, the chassis 110 defines the first flow pathway 121 and the second flow pathway 123. Although the first flow pathway 121 and/or the second flow pathway 123 are shown as being defined substantially entirely by the chassis 110 (e.g., by the external side wall 112, the first internal side wall 120 and the second internal side wall 122) in other embodiments, a chassis can define only a portion of a first flow pathway and/or a portion of a second flow pathway. In yet other embodiments, a chassis can define, only in part, a portion of a first flow pathway and/or a portion of a second flow pathway. Moreover, although the first flow pathway 121 and the second flow pathway 123 are shown in FIG. 1 as being separate and/or distinct from each other, in other embodiments, a portion of a first flow pathway and a portion of a second flow pathway can share a common boundary.

The first internal side wall 120 defines an opening 124 proximate the first end portion 133 of the line card 132. In this manner, the first flow pathway 121 extends within the chassis 110 between an intake region INT exterior to the chassis 110 and the first end portion 133 of the line card 132. More particularly, the chassis 110 is configured such that a first portion $G_1$ of a gas can flow from the intake region INT into the first flow pathway 121, as shown by the arrow AA in FIG. 1. The gas can be any suitable gas (e.g., air, nitrogen, or the like) used to cool the electronic circuits 142 and/or the line card 132. The first portion of the gas $G_1$ can flow within the first flow pathway 121, between the intake region INT and the line card 132, as shown by the arrow BB in FIG. 1. Moreover, the chassis 110 is configured such that the first portion $G_1$ of the gas can exit the first flow pathway 121 via the opening 124 and flow across the first end portion 133 of the line card 132 in a first direction, as shown by the arrow CC in FIG. 1. Similarly stated, the chassis 110 is configured such that the first portion $G_1$ of the gas can flow within the first flow pathway 121 between the intake region INT and the first end portion 133 of the line card 132 and can flow across the surface 144 of the line card 132 in a first direction.

The second internal side wall 122 defines an opening 125 proximate the second end portion 134 of the line card 132. In this manner, the second flow pathway 123 extends within the chassis 110 between the intake region INT and the second end portion 134 of the line card 132. More particularly, the chassis 110 is configured such that a second portion $G_2$ of the gas can flow from the intake region INT into the second flow pathway 123, as shown by the arrow AA' in FIG. 1. The second portion of the gas $G_2$ can flow within the second flow pathway 123, between the intake region INT and the line card 132, as shown by the arrow BB' in FIG. 1. Moreover, the chassis 110 is configured such that the second portion $G_2$ of the gas can exit the second flow pathway 123 via the opening 125 and flow across the second end portion 134 of the line card 132 in a second direction, as shown by the arrow CC' in FIG. 1. The second direction is opposite the first direction. Similarly stated, the chassis 110 is configured such that the second portion $G_2$ of the gas can flow within the second flow pathway 123 between the intake region INT and the second end portion 134 of the line card 132 and flow across the surface 144 of the line card 132 in a second direction opposite the first direction.

In this manner, the chassis 110 is configured to convey the gas to the first end portion 133 and the second end portion 134 of the line card 132 in parallel and/or opposed flow streams. Thus, the temperature of the first portion $G_1$ of the gas as it exits the opening 124 can be substantially equal to the temperature of the second portion $G_2$ of the gas as it exits the opening 125. Similarly stated, the temperature of the first portion $G_1$ of the gas as it flows across the electronic circuits 142 disposed at the first end portion 133 of the line card 132 is substantially equal to the temperature of the second portion $G_2$ of the gas as it flows across the electronic circuits 142 disposed at the second end portion 134 of the line card 132. In this manner, the portion of the gas used to cool the second end portion 134 of the line card 132 is not heated by first being used to cool the first end portion 133 of the line card 132, and vice-versa. Thus, the uniformity, efficiency and/or effectiveness of the cooling system can be improved as compared to cooling systems in which the air flows across a line card in series and/or in a single direction.

In some embodiments, for example, the flow rate of the first portion $G_1$ of the gas can be controlled independent of the flow rate of the second portion $G_2$ of the gas. In some embodiments, the temperature of the first portion $G_1$ of the gas can be controlled independent of the temperature of the second portion $G_2$ of the gas. Moreover, in some embodiments, the chassis can be configured such that the opposing flow streams of the first portion $G_1$ of the gas and the second portion $G_2$ of the gas produce a turbulent flow adjacent at least a portion of the line card 132, thereby improving the cooling efficiency of the cooling system of the chassis 110.

Although the first pathway 121 is shown and described as being an intake flow pathway (i.e., the first portion $G_1$ of the gas is shown as flowing from the intake region INT to the first end portion 133 of the line card 132), in other embodiments, the first pathway 121 can be an exhaust flow pathway (i.e., the first portion $G_1$ of the gas can flow from the first end portion 133 of the line card 132 to an exhaust region exterior to the chassis 110). Similarly, although the second pathway 123 is shown and described as being an intake flow pathway (i.e., the second portion $G_1$ of the gas is shown as flowing from the intake region INT to the second end portion 133 of the line card 132), in other embodiments, the second pathway 121 can be an exhaust flow pathway (i.e., the second portion $G_1$ of the gas can flow from the second end portion 133 of the line card 132 to an exhaust region exterior to the chassis 110).

Although the first portion $G_1$ of the gas flowing across the line card 132 is shown as having a direction CC substantially opposite the direction of the second portion $G_2$ of the gas flowing across the line card 132. in other embodiments the direction of the flow of the first portion $G_1$ of the gas need not be opposite the direction of the flow of the second portion $G_2$ of the gas.

Figure 2:
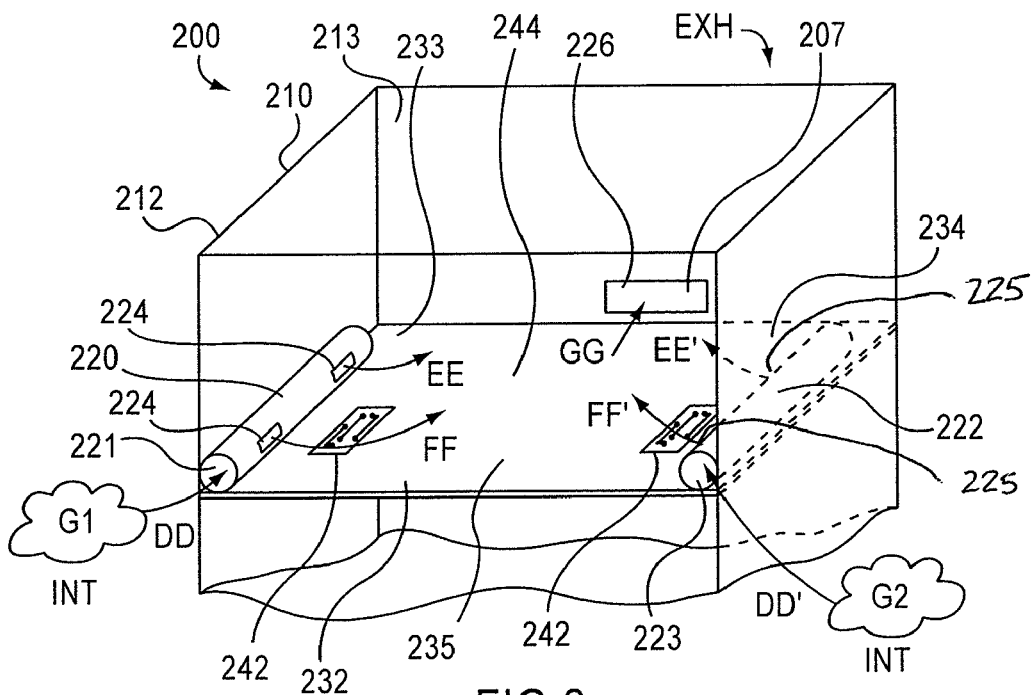
FIG. 2 is a perspective view schematic illustration of a portion of a data processing unit according to an embodiment.

For example, FIG. 2 is a perspective schematic illustration of a portion of a data processing unit 200 according to an embodiment. The data processing unit 200 includes a chassis 210 and a line card 232. Although not shown in FIG. 2, the chassis 210 can also contain additional components associated with the operation of the data processing unit 200. The chassis 210 includes a side wall 212 that defines an internal region 213 of the chassis 210 within which the line card 232 is disposed. Although the front and top portions of the side wall 212 are shown in FIG. 2 as being transparent for purposes of illustration, the side wall 212 substantially surrounds and/or encloses the internal region 213 of the chassis 210.

The line card 232 can be any suitable circuit card that can process, transmit and/or convey electronic and/or optical signals. For example, in some embodiments, the line card 232 can be similar to the line card 132 described above. The line card 232 has a first end portion 233, a second end portion 234 and a central portion 235 therebetween. The first end portion 233 of the line card 232 and the second end portion 234 of the line card 232 are each coupled to the side wall 212. A surface 244 of the line card 232 includes a set of electrical circuits 242. The electrical circuits 242 can be, for example, any printed circuit module or other suitable component for performing the data processing functions of the line card 232.

The chassis 210 includes a first duct 220 defining a first flow pathway 221 and a second duct 222 defining a second flow pathway 223. In this manner, the chassis 210 defines the first flow pathway 221 and the second flow pathway 223. Although the first flow pathway 221 and the second flow pathway 223 are shown as being defined substantially entirely by the first duct 220 and the second duct 222, respectively, in other embodiments, only a portion of the first flow pathway 221 can be defined by the first duct 220 and/or only a portion of the second flow pathway 223 can be defined by the second duct 222. In yet other embodiments, a chassis can define, only in part, a portion of a first flow pathway and/or a portion of a second flow pathway. For example, in some embodiments, a first flow pathway and/or a second flow pathway can be collectively defined by multiple structures, such as for example, a duct, a side wall, a portion of the line card 232 or the like. Moreover, although the first flow pathway 221 and the second flow pathway 223 are shown in FIG. 2 as being separate and/or distinct from each other, in other embodiments, a portion of a first flow pathway and a portion of a second flow pathway can share a common boundary.

The first duct 220 defines openings 224 proximate the first end portion 233 of the line card 232. In this manner, the first flow pathway 221 extends within the chassis 210 between an intake region INT exterior to the chassis 210 and the first end portion 233 of the line card 232. More particularly, the chassis 210 is configured such that a first portion $G_1$ of a gas can flow from the intake region INT into the first flow pathway 221, as shown by the arrow DD in FIG. 2. The first portion of the gas $G_1$ can flow within the first flow pathway 221 between the intake region INT and the line card 232 such that the first portion $G_1$ of the gas can exit the first flow pathway 221 via the openings 224 and flow across the first end portion 233 of the line card 232, as shown by the arrows EE and FF in FIG. 2. Similarly stated, the chassis 210 is configured such that the first portion $G_1$ of the gas can flow within the first flow pathway 221 between the intake region NT and the first end portion 233 of the line card 232 and can flow across the surface 244 of the line card 232 from the first end portion 233 of the line card 232.

The second duct 222 defines openings (not shown in FIG. 2) proximate the second end portion 234 of the line card 232. In this manner, the second flow pathway 223 extends within the chassis 210 between the intake region INT and the second end portion 234 of the line card 232. More particularly, the chassis 210 is configured such that a second portion $G_2$ of the gas can flow from the intake region INT into the second flow pathway 223, as shown by the arrow DD' in FIG. 2. The second portion of the gas $G_2$ can flow within the second flow pathway 223, between the intake region INT and the line card 232 such that the second portion $G_2$ of the gas can exit the second flow pathway 223 via the openings 225 and flow across the second end portion 234 of the line card 232, as shown by the arrows EE' and FF' in FIG. 2. Similarly stated, the chassis 210 is configured such that the second portion $G_2$ of the gas can flow within the second flow pathway 223 between the intake region INT and the second end portion 234 of the line card 232 and can flow across the surface 244 of the line card 232 from the second end portion 233 of the line card 232.

The rear portion of the side wall 212 defines an opening 207 proximate the central portion 235 of the line card 232. In this manner, the chassis 210 defines a third flow pathway 226 between a location proximate the central portion 235 of the line card and an exhaust region EXH exterior to the chassis 210. Thus, the chassis 210 is configured such that the first portion $G_1$ of the gas and the second portion $G_2$ of the gas can flow within the third flow pathway 226 between the location proximate the central portion 235 of the line card 232 and the exhaust region EXH, as shown by the arrow GG in FIG. 2. Although the third flow pathway 226 is shown as being defined primarily by the rear portion of the side wall 212 (e.g., the opening 207), in other embodiments, the chassis 210 can include one or more baffles, ducts and/or internal structures to define the third flow pathway 226. Although the exhaust region EXH is shown as being disposed on an opposite end of the chassis 210 from the intake region INT, in other embodiments, the exhaust region EXH and the intake region INT can be located at the same side of the chassis 210.

As described above, this cooling system arrangement allows the intake cooling gas to be conveyed in parallel to the first end portion 233 of the line card 232 and the second end portion 234 of the line card 232. Thus, the temperature of the first portion $G_1$ of the gas as it exits the openings 224 can be substantially equal to the temperature of the second portion $G_2$ of the gas as it exits the openings 225. In this manner, certain of the electronic circuits 242 disposed on the surface 244 of the line card 232 can be cooled in parallel and/or via cooling gas that has not be heated by first being used to cool other of the electronic circuits 242. Moreover, this arrangement also allows the exhaust gas to be conveyed from the interior region 213 of the chassis 210 via a centrally located flow pathway (i.e., the third flow pathway 226).

Although the first pathway 221 and the second flow pathway 223 are shown and described as being intake flow pathways, in other embodiments, the first pathway 221 and/or the second flow pathway 223 can be exhaust flow pathways. Similarly, although the third pathway 226 is shown and described as being an exhaust flow pathway, in other embodiments, the third pathway 226 can be an intake flow pathway.

Although the first portion $G_1$ of the gas flowing across the line card 232 is shown as having a direction FF that is not directly opposing the direction FF' of the second portion $G_2$ of the gas flowing across the line card 232, in other embodiments, the flow direction of the first portion $G_1$ of the gas flowing across the line card 232 can be substantially opposite the flow direction of the second portion $G_2$ of the gas flowing across the line card 232. In yet other embodiments, the flow direction of the exhaust flow (i.e., the first portion $G_1$ of the gas flowing and the second portion $G_2$ of the gas flowing within the third flow pathway 226) can be substantially orthogonal to the flow direction FF of the first portion $G_1$ of the gas flowing across the line card 232 and/or the flow direction FF' of the second portion $G_2$ of the gas flowing across the line card 232.

Although the first duct 220 and the second duct 222 are shown as being substantially cylindrical, in other embodiments, the first duct 220 and the second duct 222 can have any suitable shape. Although the chassis 210 is shown and described as defining the third flow pathway 226 via the opening 207, in other embodiments, the chassis 210 can include additional structure, such as internal side walls, ducts or the like to define a portion of the third flow pathway 226.

Figure 3:
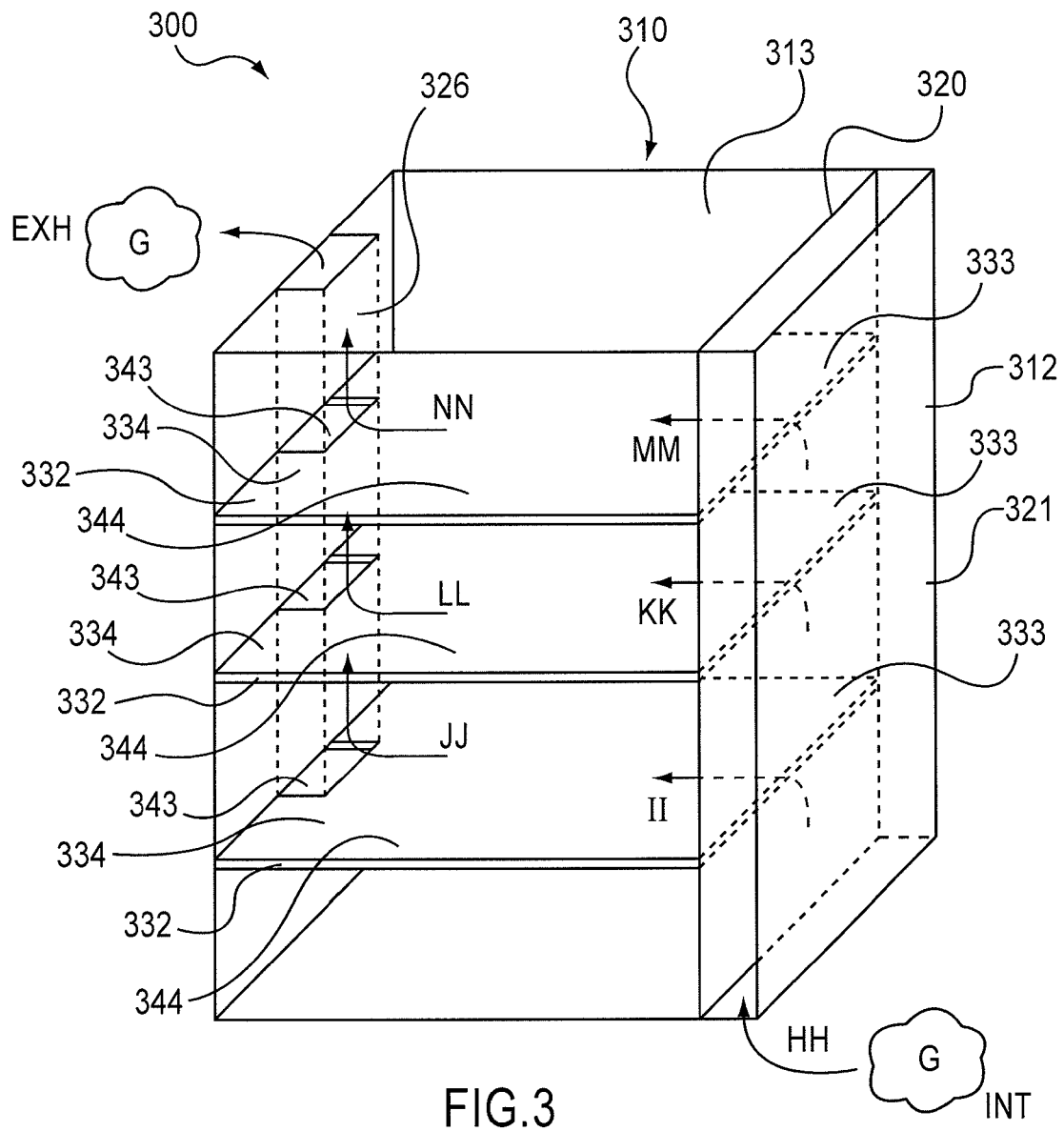
FIG. 3 is a perspective view schematic illustration of a data processing unit according to an embodiment.

Although the first flow pathway 221, the second flow pathway 223 and the third flow pathway 226 is shown as being defined substantially entirely by the chassis 210 (i.e., the duct 220, the second duct 222, and the side wall 212, respectively), in other embodiments, only a portion of the first flow pathway 221, the second flow pathway 223 and/or the third flow pathway 226 can be defined by the chassis 210. In yet other embodiments, a chassis can define, only in part, a portion of a first flow pathway, a second flow pathway and/or a third flow pathway. Similarly stated, in yet other embodiments, a portion of a first flow pathway, a second flow pathway and/or a third flow pathway can be defined by a chassis and another component within the data processing unit (e.g., a card, a power supply module, a cable interface or the like). For example, FIG. 3 is a perspective view of a data processing unit 300 according to an embodiment. The data processing unit 300 includes a chassis 310 and a set of line cards 332. Although not shown in FIG. 3, the chassis 310 can also contain additional components associated with the operation of the data processing unit 300.

The chassis 310 includes a side wall 312 that defines an internal region 313 of the chassis 310 within which the line cards 332 are disposed. Although the front and top portions of the side wall 312 are shown in FIG. 3 as being transparent for purposes of illustration, the side wall 312 substantially surrounds and/or encloses the internal region 313 of the chassis 310. The chassis 310 includes an internal side wall 320, which can be a structural member having coupling portions (not shown) configured to retain and/or support the line cards 132. In some embodiments, the coupling portions can be separate members, such as clips, brackets or the like. In other embodiments, the coupling portions can be monolithically formed with the internal side wall 320, such as, for example, slots, protrusions or the like. Although the internal side wall 320 is shown as being substantially planar and parallel to a portion of the side wall 312, in other embodiments, the internal side wall 320 and can have any suitable shape and can be disposed in any orientation relative to the side wall 312.

The line cards 332 are any suitable circuit card that can process, transmit and/or convey electronic and/or optical signals. For example, in some embodiments, the line cards 332 can be similar to the line card 132 described above. A first end 333 of each line card 332 is coupled to the internal side wall 320 and a second end 334 of each line card 332 is coupled to the side wall 312 such that the line cards 332 are disposed within the interior region 313 of the chassis 310 in a substantially parallel arrangement. Similarly stated, the line cards 332 are disposed within the chassis 310 such that a surface 344 of each line card 332 is substantially parallel to the surface 344 of the adjacent line card 332. Although the line cards 332 are disposed within the chassis 310 in a substantially parallel arrangement, in other embodiments, the line cards 332 can be disposed within the chassis 310 in any suitable arrangement.

The second end portion 334 of each line card 332 defines an opening 343. As shown in FIG. 3, the line cards 332 are disposed within the chassis 310 such that the opening 343 of each line card 332 is substantially aligned with the opening 343 of the adjacent line card 332. In this manner, as described in more detail below, the line cards 332 and the side wall 312 of the chassis 310 collectively form an exhaust flow pathway 326. A portion of the boundary of the third flow pathway 326 is shown as dotted lines in FIG. 3. Although the exhaust flow pathway 326 is shown as being defined primarily by the line cards 332 (e.g., the openings 343), in other embodiments, the chassis 310 can include one or more baffles, ducts and/or internal structures to define the exhaust flow pathway 326. Although the openings 343 are shown as being substantially rectangular, in other embodiments, the openings 343 can have any suitable shape. Although the openings 343 are shown as being bounded by a portion of the line cards 332 and the side wall 312, in other embodiments, the openings 343 can be bounded entirely by the line cards 332.

The side wall 312 and the internal side wall 320 collectively define an intake flow pathway 321. Similarly stated, the chassis 310 defines the intake flow pathway 321. Although the intake flow pathway 321 is shown as being defined substantially entirely by the chassis 310 (e.g., by the side wall 312 and the internal side wall 320) in other embodiments, a chassis can define only a portion of an intake flow pathway. In yet other embodiments, a chassis can define, only in part, a portion of an intake flow pathway. The intake flow pathway 321 extends within the chassis 310 between an intake region INT exterior to the chassis 310 and the first end portion 333 of each line card 332. More particularly, the chassis 310 is configured such that a gas G can flow from the intake region INT into the intake flow pathway 321, as shown by the arrow HH in FIG. 3. The chassis 310 is configured such that the gas G can exit the first flow pathway 321 and flow across the surface 344 of each line card 332, as shown by the arrows II, KK and MM in FIG. 3. Said another way, the chassis 310 is configured such that the gas G can exit the first flow pathway 321 and flow in a direction substantially parallel to the surface 344 of each line card 332. Similarly stated, the chassis 310 is configured such that the gas G can flow within the first flow pathway 321 between the intake region INT and the first end portion 333 of each line card 332. In this manner, the chassis 310 is configured to supply the gas G to cool each of the line cards 332 via a substantially parallel flow circuit.

As described above, the chassis 310 and the line cards 332 collectively define an exhaust flow pathway 326 between the second end portion 334 of each line card 332 and an exhaust region EXH exterior to the chassis 310. Thus, the line cards 332 and the chassis 310 are collectively configured such that the gas G can flow within the exhaust flow pathway 326 from the second end portion 334 of each line card 332, as shown by the arrows JJ, LL and NN in FIG. 3. Said another way, the line cards 332 and the chassis 310 are collectively configured such that the gas G can flow from a region proximate the surface 344 of each line card 332 into the exhaust flow pathway 326, as shown by the arrows JJ, LL and NN in FIG. 3. Similarly stated, the line cards 332 and the chassis 310 are collectively configured such that the gas G can flow from the second end portion 334 of the each line card 332 in a direction substantially orthogonal to the surface 344 of each line card 332. In this manner, the line cards 332 and the chassis 310 are collectively configured to remove the exhaust gas G used to cool each of the line cards 332 via a substantially parallel flow circuit.

Although the intake flow pathway 321 is shown and described as receiving an intake gas to be supplied to the interior region 313 of the chassis 310, in other embodiments, an exhaust gas can flow from the interior region 313 out of the chassis 310 via the intake flow pathway 321. Although the exhaust gas is shown and described as flowing within exhaust flow pathway 326 out of the chassis 310, in other embodiments, intake gas can flow into the interior region 313 via the exhaust flow pathway 326. Similarly stated, in other embodiments, the chassis 310 and the line cards 332 can collectively form an intake flow pathway within which intake gas can flow.

FIGS. 4-9 show a data processing unit 400 according to an embodiment having an orthogonal midplane configuration. The data processing unit 400 includes a chassis 410, a midplane 414 disposed within the chassis 410, a first (i.e., rear) set of line cards 430 (see e.g., FIGS. 5-7) and a second (i.e., front) set of line cards 450 (see e.g., FIGS. 4, 6 and 7). The chassis 410 includes an enclosure 412 that defines an internal region 413 of the chassis 410. The midplane 414 is disposed within the internal region 413 such that the chassis 410 is divided into a front portion 418 and a rear portion 419. The first set of line cards 430 is disposed within the rear portion 419 of the chassis 410 in a substantially horizontal orientation, and is coupled to the rear side of the midplane 414. The second set of line cards 450 is disposed within the front portion 418 of the chassis 410 in a substantially vertical orientation, and is coupled to the front side of the midplane 414. In this manner, the first set of line cards 430 is oriented substantially orthogonal to the second set of line cards 450. Similarly stated, in this manner, the data processing unit 400 has an orthogonal midplane configuration.

The first set of line cards 430 includes line cards 432. Similarly, the second set of line cards 450 includes line cards 452. Only a portion of the line cards 432 and the line cards 452 are identified in FIGS. 4-9 for purposes of clarity. Each of the line cards 432, 452 can be any suitable circuit card that can process, transmit and/or convey electronic and/or optical signals. For example, in some embodiments, the line cards 432, 452 can include a printed circuit board populated with one or more electronic circuits (e.g., modules, chips, integrated circuit packages, etc.) configured to perform the functions of the data processing unit 400. In some embodiments, for example, the line cards 432, 452 can be configured to convert optical signals to and from electrical signals. In some embodiments, the line cards 432, 452 can be configured to transmit multiple signals associated with one or more data streams to and from other line cards and/or other data processing units (not shown) within a communications network. In some embodiments, the line cards 432 can have a different design and/or perform different functions than the line cards 452. In other embodiments, the line cards 432 and the line cards 452 can have substantially the same design and/or perform substantially the same functions.

Figure 7:
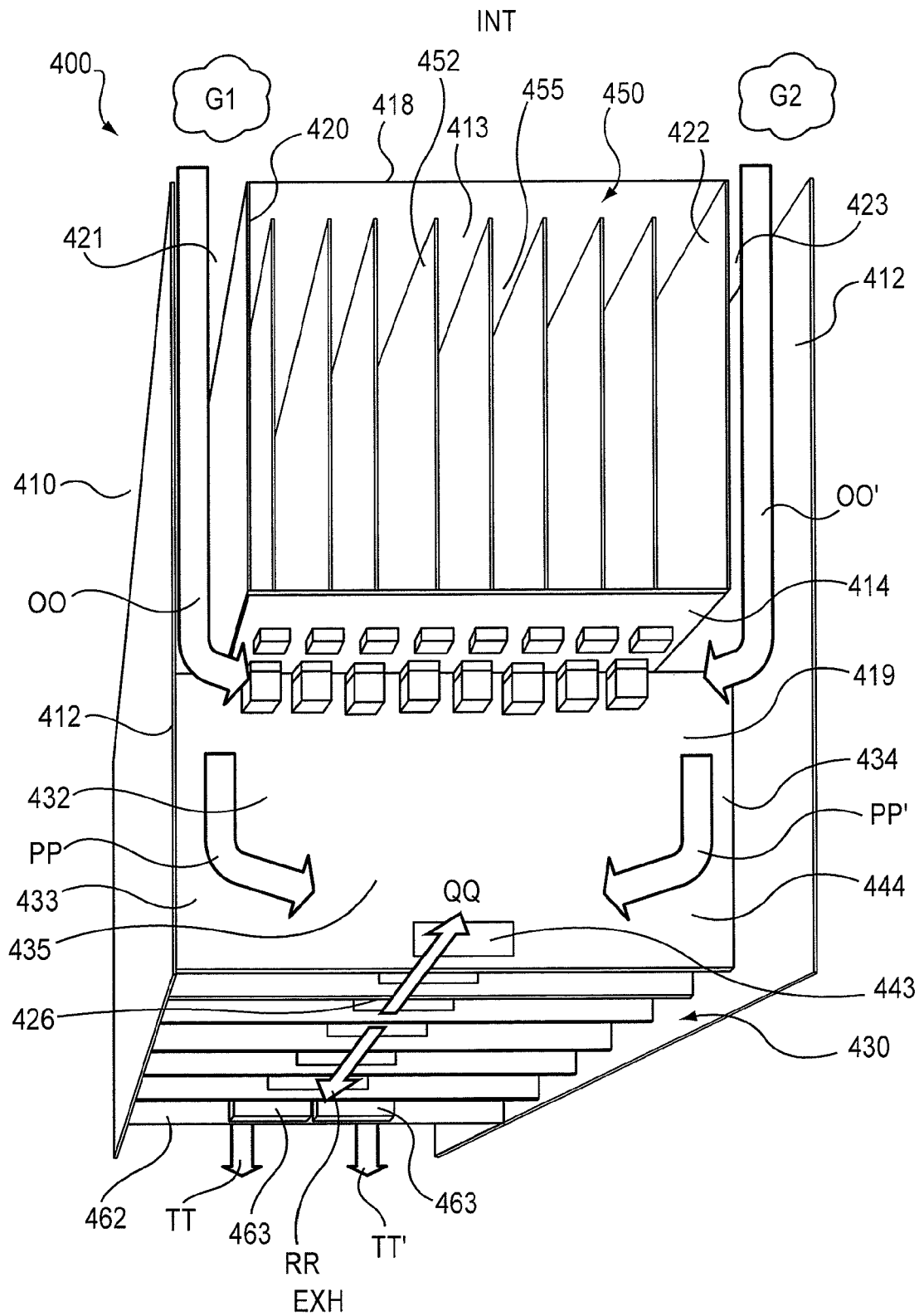
FIG. 7 is a perspective cross-sectional view of the data processing unit shown in FIG. 4 taken along line $X_3$-$X_3$ shown in FIG. 5.
Figure 8:
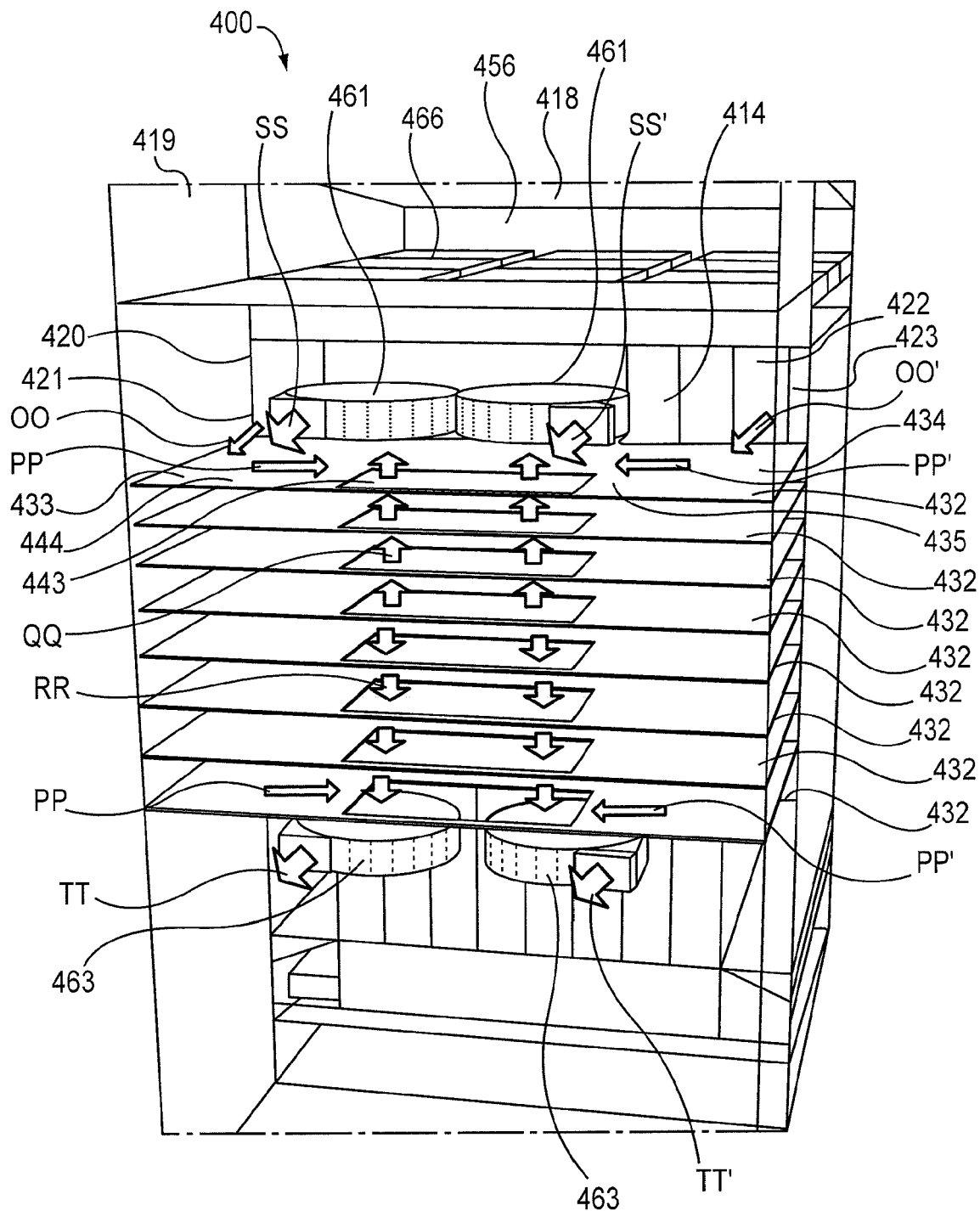
FIG. 8 is a perspective rear view of the data processing unit shown in FIG. 4 with a portion of the enclosure removed.

As shown in FIGS. 7 and 8, each of the line cards 432 has a first end portion 433, a second end portion 434, and a central portion 435 therebetween. The first end portion 433 of each line card 432 and the second end portion 434 of each line card 432 are coupled to the enclosure 412 of the chassis 410 within the rear portion 419 of the chassis 410. In this manner, the line cards 432 are disposed within the rear portion 419 of the chassis 410 in a substantially parallel and horizontal arrangement. Similarly stated, the line cards 432 are disposed within the chassis 410 such that a surface 444 of each line card 432 is substantially parallel to the surface 444 of the adjacent line card 432. Moreover, the surface 444 of each line card 432 is substantially horizontal relative to the support structure (e.g., the floor) upon which the data processing unit 400 is disposed. Although the line cards 432 are disposed within the rear portion 419 of the chassis 410 in a substantially parallel and horizontal arrangement, in other embodiments, the line cards 432 can be disposed within the chassis 410 in any suitable arrangement.

Figure 6:
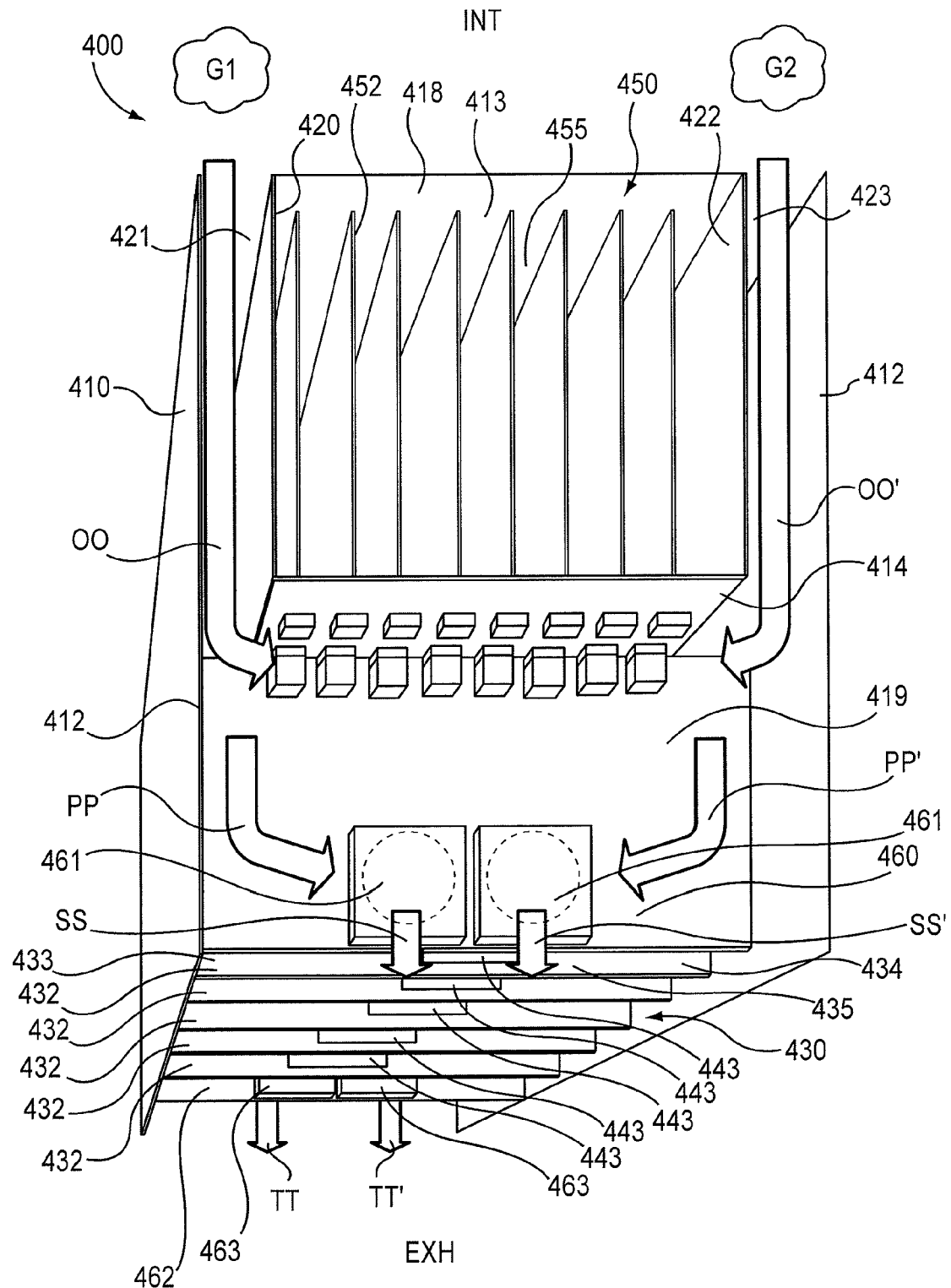
FIG. 6 is a perspective cross-sectional view of the data processing unit shown in FIG. 4 taken along line $X_2$-$X_2$ of FIG. 5.

The central portion 435 of each line card 432 defines an opening 443. As shown in FIGS. 6-8, the line cards 432 are disposed within the rear portion 419 of the chassis 410 such that the opening 443 of each line card 432 is substantially aligned with the opening 443 of the adjacent line card 432. In this manner, as described in more detail below, the line cards 432 and the chassis 410 collectively form a third flow pathway 426. Although the third flow pathway 426 is shown as being defined primarily by the line cards 432 (e.g., the openings 443), in other embodiments, the chassis 410 can include one or more baffles, ducts and/or internal structures to define the third flow pathway 426.

Figure 9:
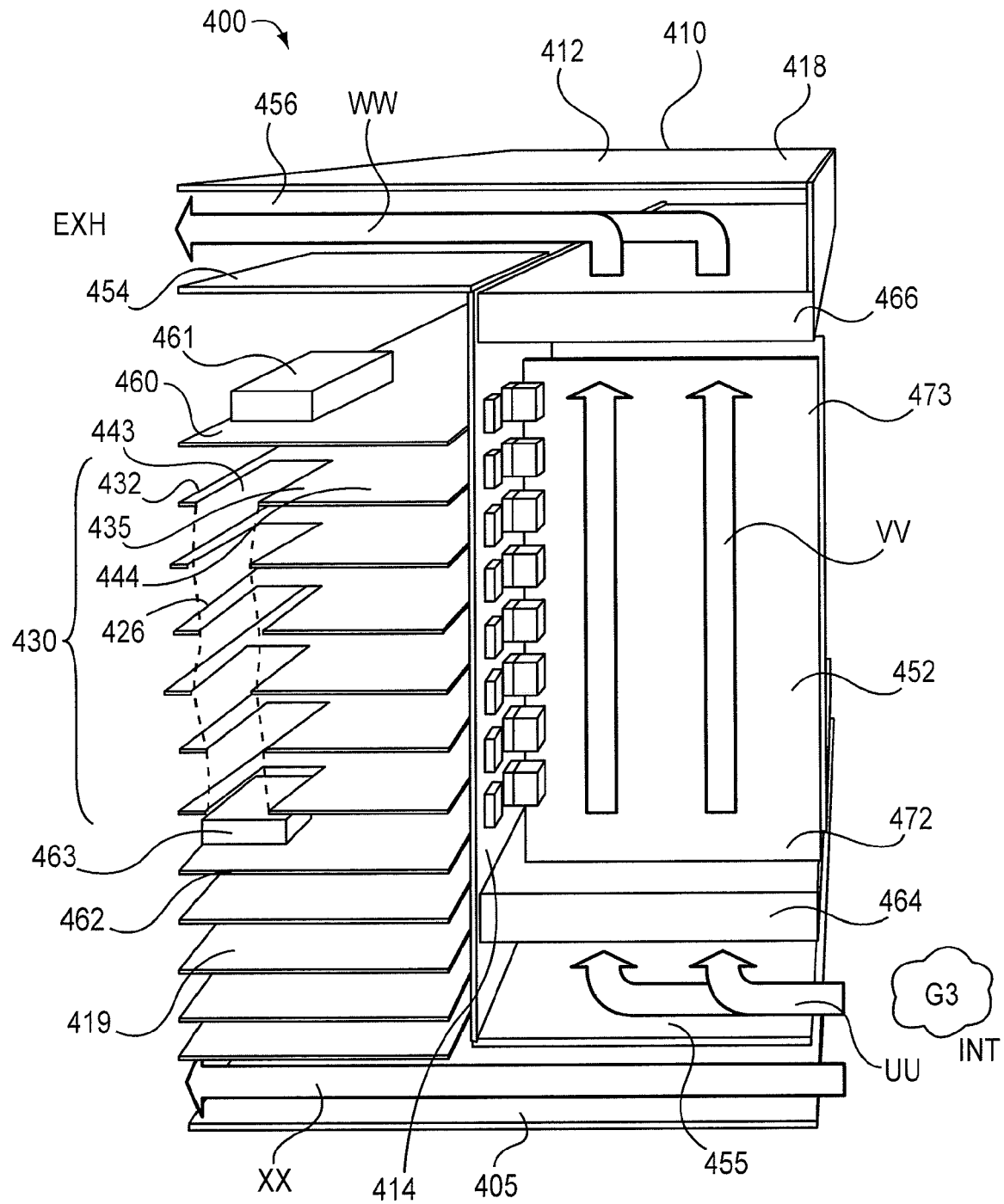
FIG. 9 is a perspective cross-sectional view of the data processing unit shown in FIG. 4 taken along line $X_1$-$X_1$ shown in FIG. 4.

As shown in FIG. 9, each of the line cards 452 has a first end portion 472 and a second end portion 473. The line cards 452 are disposed within the front portion 418 of the chassis 410 in a substantially parallel and vertical arrangement. Similarly stated, the line cards 452 are disposed within the chassis 410 such that a surface of each line card 452 is substantially parallel to the surface of the adjacent line card 452. Moreover, the surface of each line card 452 is substantially vertical relative to the support structure (e.g., the floor) upon which the data processing unit 400 is disposed. Although the line cards 452 are disposed within the front portion 418 of the chassis 410 in a substantially parallel and vertical arrangement, in other embodiments, the line cards 452 can be disposed within the chassis 410 in any suitable arrangement.

Figure 4:
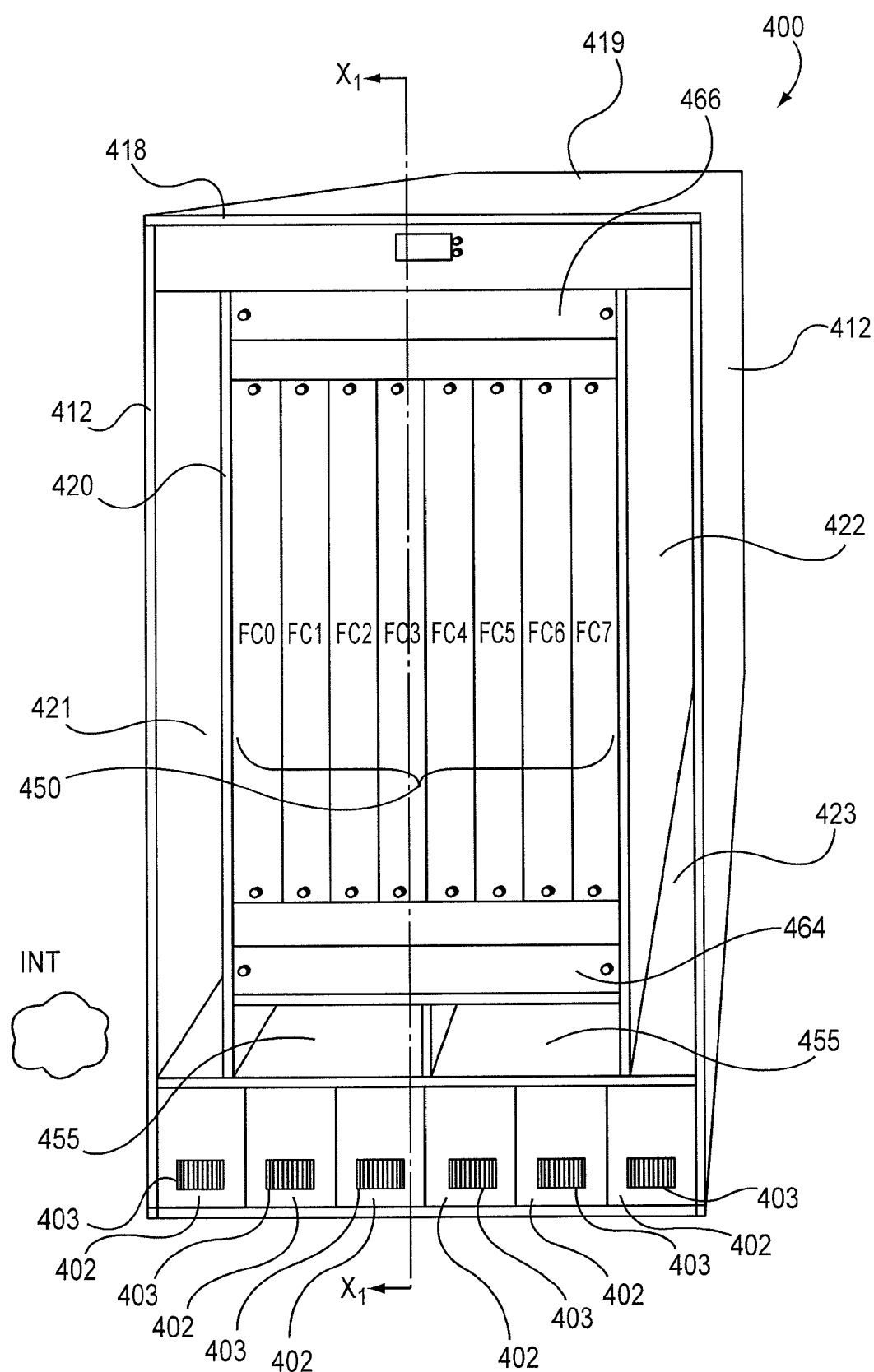
FIG. 4 is a perspective front view of a data processing unit according to an embodiment.

As shown in FIGS. 4, 6 and 7, the front portion 418 of the chassis 410 includes a first internal side wall 420 and a second internal side wall 422. The first internal side wall 420 and the second internal side wall 422 are each substantially parallel to each of the line cards 452 of the second set of line cards 450. Moreover, the first internal side wall 420 and the second internal side wall 422 define an enclosure within which the second set of line cards 450 is disposed. In some embodiments, the first internal side wall 420 and/or the second internal side wall 422 can include coupling members and/or portions (not shown), such as clips, brackets, slots, or the like, configured to retain and/or support the line cards 452 and/or any other components housed within the chassis 410.

The enclosure 412 and the first internal side wall 420 collectively define a first flow pathway 421. The enclosure 412 and the second internal side wall 422 collectively define a second flow pathway 423. Similarly stated, the chassis 410 defines the first flow pathway 421 and the second flow pathway 423. Although the first flow pathway 421 and the second flow pathway 423 are shown as being defined substantially entirely by the chassis 410 (e.g., by the enclosure 412, the first internal side wall 420 and the second internal side wall 422) in other embodiments, a chassis can define only a portion of a first flow pathway and/or a portion of a second flow pathway. In yet other embodiments, a chassis can define, only in part, a portion of a first flow pathway and/or a portion of a second flow pathway.

The first flow pathway 421 extends within the chassis 410 between an intake region INT exterior to the chassis 410 (see e.g., FIGS. 4 and 7) and the first end portion 433 of each of the line cards 432. More particularly, the chassis 410 is configured such that a first portion of intake air G1 can flow from the intake region INT into the first flow pathway 421, as shown by the arrow OO in FIGS. 6 and 7. The chassis 410 is configured such that the first portion of intake air G1 can exit the first flow pathway 421 and flow across the surface 444 of each line card 432 from the first end portion 433 towards the central portion 435, as shown by the arrow PP in FIGS. 6-8. Similarly stated, the chassis 410 is configured such that the first portion of intake air G1 can exit the first flow pathway 421 and flow substantially parallel to the surface 444 of each line card 432. In this manner, the chassis 410 is configured to supply the first portion of intake air G1 to cool each of the line cards 432 via a substantially parallel flow circuit. In some embodiments, the chassis 410 is configured such that at least a portion of the first portion of intake air G1 can exit the first flow pathway 421 and flow across the surface 444 of each line card 432 in a first direction substantially parallel to a longitudinal axis of the line card 432.

The second flow pathway 423 extends within the chassis 410 between the intake region INT exterior to the chassis 410 and the second end portion 434 of each of the line cards 432. More particularly, the chassis 410 is configured such that a second portion of intake air G2 can flow from the intake region INT into the second flow pathway 423, as shown by the arrow OO' in FIGS. 6 and 7. The chassis 410 is configured such that the second portion of intake air G2 can exit the second flow pathway 423 and flow across the surface 444 of each line card 432 from the second end portion 434 towards the central portion 435, as shown by the arrow PP' in FIGS. 6-8. Similarly stated, the chassis 410 is configured such that the second portion of intake air G2 can exit the second flow pathway 423 and flow substantially parallel to the surface 444 of each line card 432. In this manner, the chassis 410 is configured to supply the second portion of the intake air G2 to cool each of the line cards 432 via a substantially parallel flow circuit. In some embodiments, the chassis 410 is configured such that at least a portion of the second portion of intake air G2 can exit the second flow pathway 423 and flow across the surface 444 of each line card 432 in a second direction substantially parallel to a longitudinal axis of the line card 432, and opposite the first direction.

As shown in FIGS. 7 and 8, the rear portion 419 of the chassis 410 includes an upper fan tray 460 and a lower fan tray 462. The upper fan tray 460 includes two fans or blowers 461 configured to produce (or define, at least in part) an airflow within the chassis 410. The lower fan tray 462 includes two fans or blowers 463 configured to produce (or define, at least in part) an airflow within the rear portion 419 of the chassis 410. Similarly stated, the blowers 461 and 463 are configured to produce an airflow within the chassis 410 such that the first portion G1 and the second portion G2 of the intake air can flow within the first flow pathway 421 and the second flow pathway 423, as described above. The blowers 461 and 463 further produce an airflow such that the exhaust air (i.e., the first portion G1 and the second portion G2 of the intake air after flowing across a portion of the a line card 432) can flow within the exhaust flow pathway 426, as described below. Although the upper fan tray 460 and the lower fan tray 462 are each shown as including two distinct blowers (e.g., blowers 461 and 463, respectively), in other embodiments, the upper fan tray 460 and/or the lower fan tray 462 can include a single blower. In yet other embodiments, the upper fan tray 460 and/or the lower fan tray 462 can include a blower having a dual impeller configuration. For example, in some embodiments, the blower 461 and/or the blower 463 can be the SFB 196×109×33 mm series dual impeller blower produced by Delta Electronics, Inc.

As described above, the chassis 410 and the line cards 432 collectively define a third flow pathway 426 (see e.g., FIG. 7) such that the exhaust air can flow between the central portion 435 of each line card 432 and an exhaust region EXH exterior to the chassis 410 (see e.g., FIGS. 6 and 7). As shown in FIGS. 7 and 8, the blowers 461 of the upper fan tray 460 are configured to produce an airflow within the third flow pathway 426 such that a portion of the exhaust air flows in a first direction (e.g., upward) within the third flow pathway 426 and into the blowers 461, as shown by the arrow QQ. The exhaust air exits the blowers 461, as shown, by the arrows SS and SS' and flows to the exhaust region EXH via the exhaust openings 407 defined by the chassis 410 (see e.g., FIGS. 5 and 6). The blowers 463 of the lower fan tray 462 are configured to produce an airflow within the third flow pathway 426 such that a portion of the exhaust air flows in a second direction (e.g., downward) within the third flow pathway 426, as shown by the arrow RR. The exhaust air exits the blowers 463, as shown, by the arrows TT and TT' and flows to the exhaust region EXH via the exhaust openings 407 defined by the chassis 410.

Thus, the chassis 410 is configured such that the exhaust air can flow within the third flow pathway 426 from the central portion 435 of each line card 432, as shown by the arrows QQ and RR in FIGS. 7 and 8. Said another way, the chassis 410 is configured such that the exhaust air can flow from a region proximate the surface 444 of each line card 432 into the third flow pathway 426, as shown by the arrows QQ and RR in FIGS. 7 and 8. Similarly stated, the chassis 410 is configured such that the exhaust air can flow from the central portion 435 of the each line card 432 in a direction substantially orthogonal to the surface 444 of each line card 432. In this manner, the chassis 410 is configured to remove the air used to cool each of the line cards 432 via a substantially parallel flow circuit.

As shown in FIGS. 4, 8 and 9, the front portion 418 of the chassis 410 includes an upper fan tray 466 and a lower fan tray 464. The upper fan tray 466 and the lower fan tray 464 each include fans or blowers configured to produce (or define, at least in part) an airflow within the chassis 410. The blowers (not identified in FIGS. 4 and 9) are configured produce an airflow such that a third portion G3 of intake air can flow across the second set of line cards 450, as described below. The upper fan tray 466 and/or the lower fan tray 464 can include any number and/or type of blowers. In some embodiments, for example, the upper fan tray 466 can include a different blower configuration than the lower fan tray 464. In other embodiments, the upper fan tray 466 and/or the lower fan tray 464 can include blowers different from the blowers 461 and 463 described above. In yet other embodiments, the blowers included in the upper fan tray 466 and the lower fan tray 464 can be the same as the blowers 461 and 463 described above.

As shown in FIGS. 4 and 9, the first internal side wall 420 and the second internal side wall 422 collectively define a fourth flow pathway 455. The fourth flow pathway 455 extends within the chassis 410 between the intake region INT exterior to the chassis 410 and the first end portion 472 of each of the line cards 452 from the second set of line cards 450. More particularly, the chassis 410 is configured such that a third portion G3 of intake air can flow from the intake region INT into the fourth flow pathway 455, as shown by the arrow UU in FIG. 9. The chassis 410 is configured such that the third portion G3 of intake air can flow via the blowers in the lower fan tray 464 from the fourth flow pathway 455 and across the surface of each line card 452. More particularly, the chassis 410 is configured such that the third portion G3 of the intake air can flow across each line card 452 from the first end portion 472 towards the second end portion 473, as shown by the arrow VV in FIG. 9. Similarly stated, the chassis 410 is configured such that the third portion G3 of intake air can flow substantially parallel to a surface of each line card 452. In this manner, the chassis 410 is configured to supply the third portion G3 of the intake air to cool each of the line cards 452 via a substantially parallel flow circuit.

Moreover, the fourth flow pathway 455 is substantially isolated from the first flow pathway 421 and the second flow pathway 423. In this manner, the quantity of airflow (e.g., mass flow rate, volumetric flow rate or the like) within the fourth flow pathway 455 is independent of the quantity of airflow within the first flow pathway 421 and/or the second flow pathway 423. Said another way, the flow rate of cooling air supplied to the second set of line cards 450 is independent of the flow rate of cooling air supplied to the first set of line cards 430. In this manner, the flow rate of cooling air supplied the front portion 418 of the chassis 410 can be adjusted without adjusting (e.g., diverting air from or to) the flow rate of cooling air supplied to the rear portion 419 of the chassis 410.

As shown in FIG. 9, the chassis 410 includes a third internal side wall 454 substantially parallel to the top portion of the enclosure 412. The enclosure 412 and the third internal side wall 454 collectively define a fifth flow pathway 456 such that the exhaust air can flow between the second end portion 473 of each line card 452 and an exhaust region EXH exterior to the chassis 410. More particularly, the chassis 410 is configured such that the third portion G3 of intake air can flow via the blowers in the upper fan tray 466 from the second end portion 473 of each line card 452 to the exhaust region EXH, as shown by the arrow WW in FIG. 9. The third portion G3 of the intake air is conveyed from the internal region 413 of the chassis 410 via the exhaust openings 408 defined by the chassis 410 (see e.g., FIG. 5).

Moreover, the fifth flow pathway 456 is substantially isolated from the third flow pathway 426. Similarly stated, the exhaust flow path of the front portion 418 (i.e., the fifth flow pathway 456) is fluidically isolated from the exhaust flow path of the rear portion (i.e., the third flow pathway 426). In this manner, the quantity of airflow (e.g., mass flow rate, volumetric flow rate or the like) within the fifth flow pathway 456 is independent of and/or does not influence the quantity of airflow within the third flow pathway 426. Similarly stated, in this manner, a restriction, impedance or the like within the fifth flow pathway 456 has no substantial effect on the flow rate of exhaust air within the third flow pathway 426.

Figure 5:
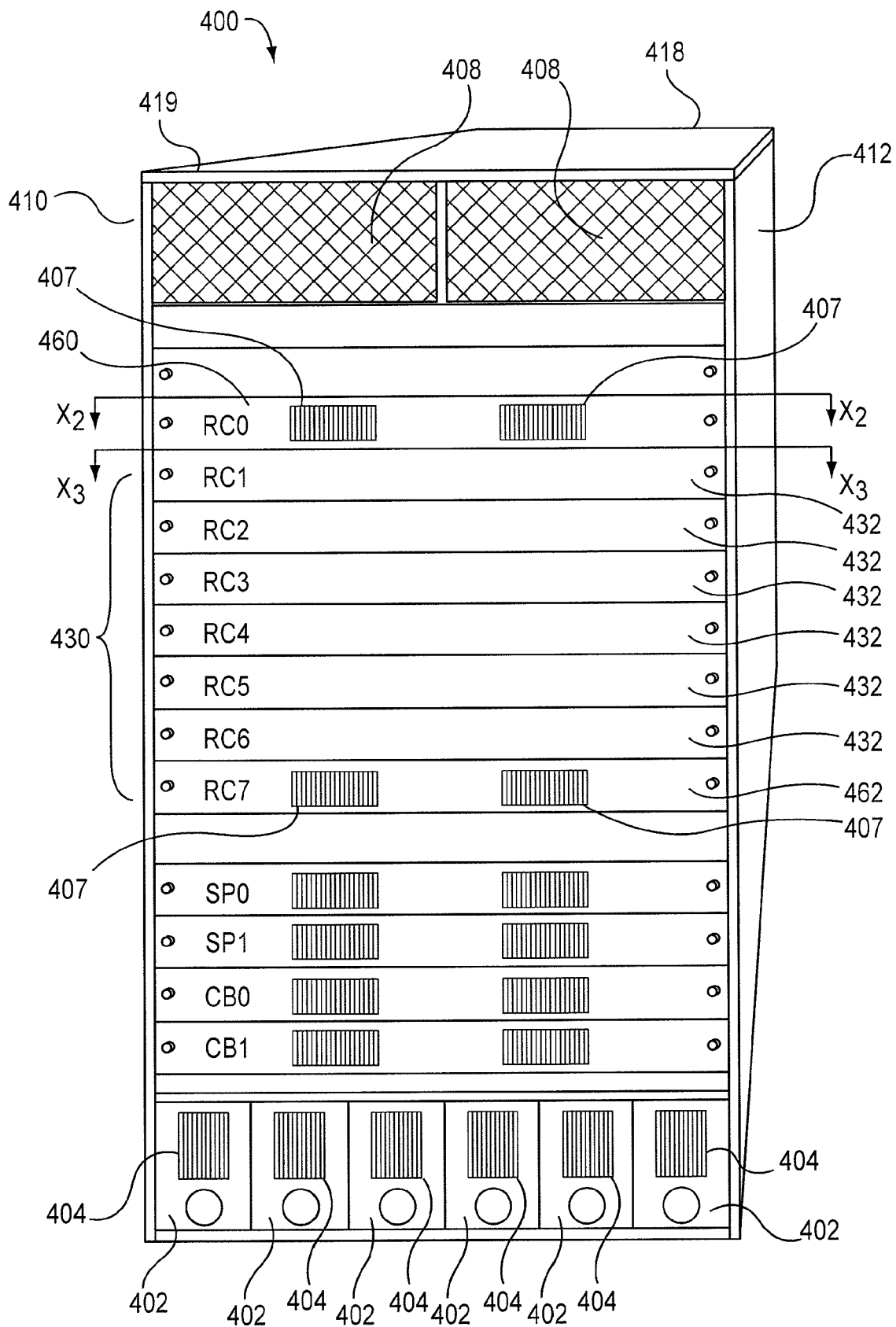
FIG. 5 is a perspective rear view of the data processing unit shown in FIG. 4.

As shown in FIGS. 4 and 5, the lower portion of the chassis 410 contains a set of power supplies 402. The front portion 418 of the chassis 410 defines an inlet opening 403 associated with each of the power supplies 402. As shown in FIG. 5, the rear portion 419 of the chassis 410 defines an outlet opening 404 associated with each of the power supplies 402. As shown in FIG. 9, the chassis 410 further defines a flow pathway 405 through which cooling air can flow to cool the power supplies 402. In operation, cooling air can flow through the inlet openings 403, within the flow pathway 405, and out of outlet openings 404, as shown by the arrow XX, to cool the power supplies 402.

Although the openings 443 defined by the line cards 432 are shown as being substantially rectangular, in other embodiments, the openings 443 can have any suitable shape. Although the openings 443 are shown as being defined solely by the line cards 432, in other embodiments, an opening can be bounded by a portion of a line cards and a side wall of the chassis. Although the line cards 432 are each shown as defining a single opening 443, in other embodiments, a line card can define any number of openings and/or flow pathways.

Figure 10:
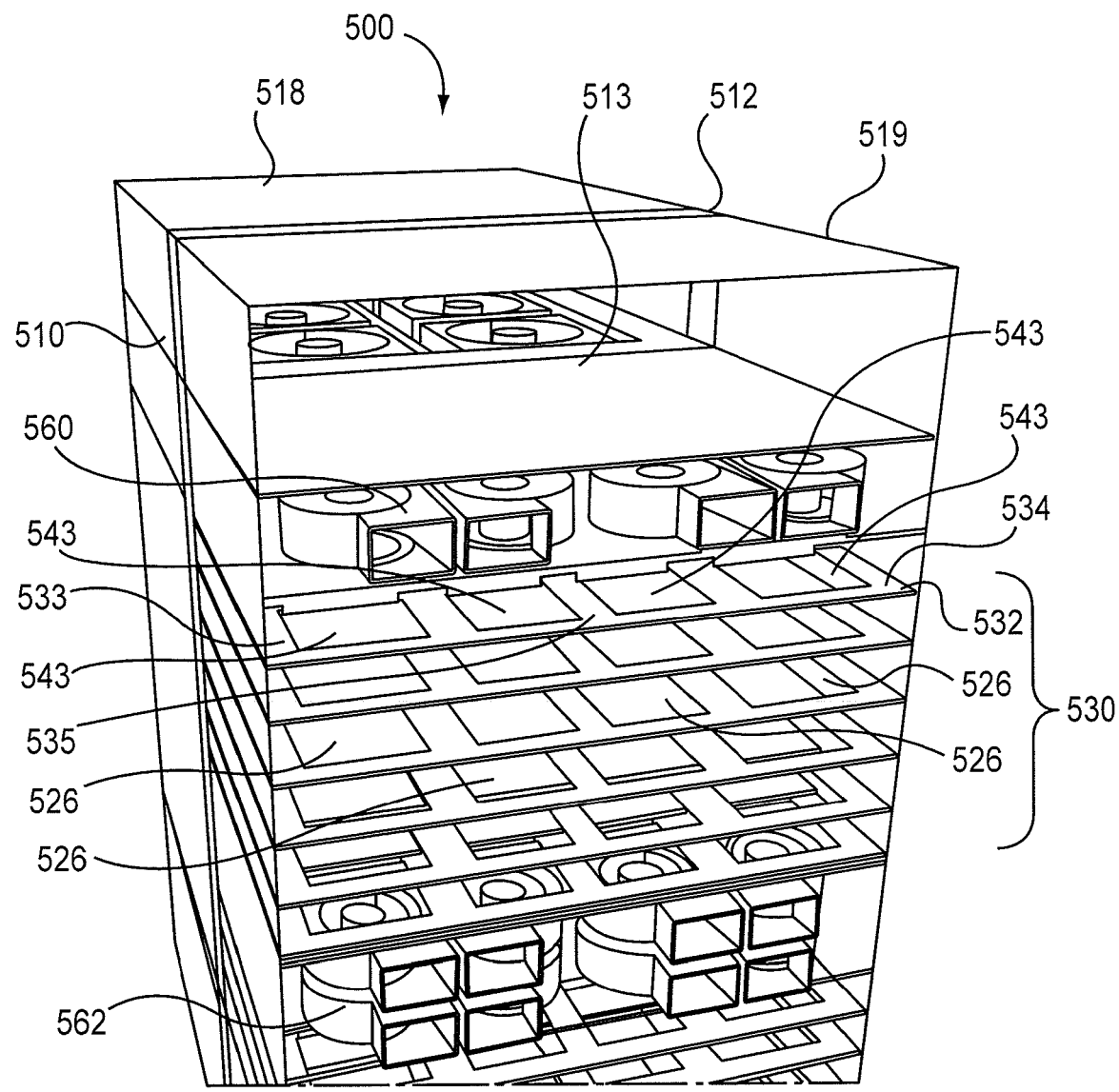
FIG. 10 is a rear perspective view of a portion of a data processing unit according to an embodiment.

For example, FIG. 10 shows a portion of a data processing unit 500 according to another embodiment having an orthogonal midplane configuration. The data processing unit 500 is similar to the data processing unit 400 in that the chassis 510 defines multiple intake air flow pathways similar to the flow pathways 421, 423 and 455 described above. The data processing unit 500 differs from the data processing unit 400, however, in that the chassis 510 and the first set of line cards 530 define multiple exhaust flow pathways 526, as described in more detail below.

The data processing unit 500 includes a chassis 510, a midplane (not shown in FIG. 10) disposed within the chassis 510 that divides the chassis 510 into a front portion 518 and a rear portion 519. The data processing unit 500 includes a first (i.e., rear) set of line cards 530 disposed within the rear portion 519 and a second (i.e., front) set of line cards (not shown) disposed within the front portion 518. The chassis 510 includes an enclosure 512 that defines an internal region 513 of the chassis 510.

The first set of line cards 530 includes line cards 532. Each of the line cards 532 can be any suitable circuit card of the types shown and described herein, that can process, transmit and/or convey electronic and/or optical signals. Each of the line cards 532 has a first end portion 533, a second end portion 534, and a central portion 535 therebetween. As shown in FIG. 10, the first end portion 533 of each line card 532 and the second end portion 534 of each line card 532 are coupled to the enclosure 512 of the chassis 510 within the rear portion 519 of the chassis 510. In this manner, the line cards 532 are disposed within the rear portion 519 of the chassis 510 in a substantially parallel and horizontal arrangement. Although the line cards 532 are disposed within the rear portion 519 of the chassis 510 in a substantially parallel and horizontal arrangement, in other embodiments, the line cards 532 can be disposed within the chassis 510 in any suitable arrangement.

Each of the line cards 532 includes a support member 541 and a printed circuit board 540 coupled to the support member 541. The support member 541 is configured to enhance the strength and/or rigidity of the line card 532. For example, in some embodiments, the support member 541 can be a metallic member that includes coupling portions (not shown in FIG. 11) to facilitate the coupling between the line card 532 and the chassis 510. In other embodiments, the support member 541 can enhance other properties of the line card 532, such as for example, the thermal conductivity of the line card 532, the electromagnetic interference (EMI) noise characteristics of the line card 532 and/or the like.

Figure 11:
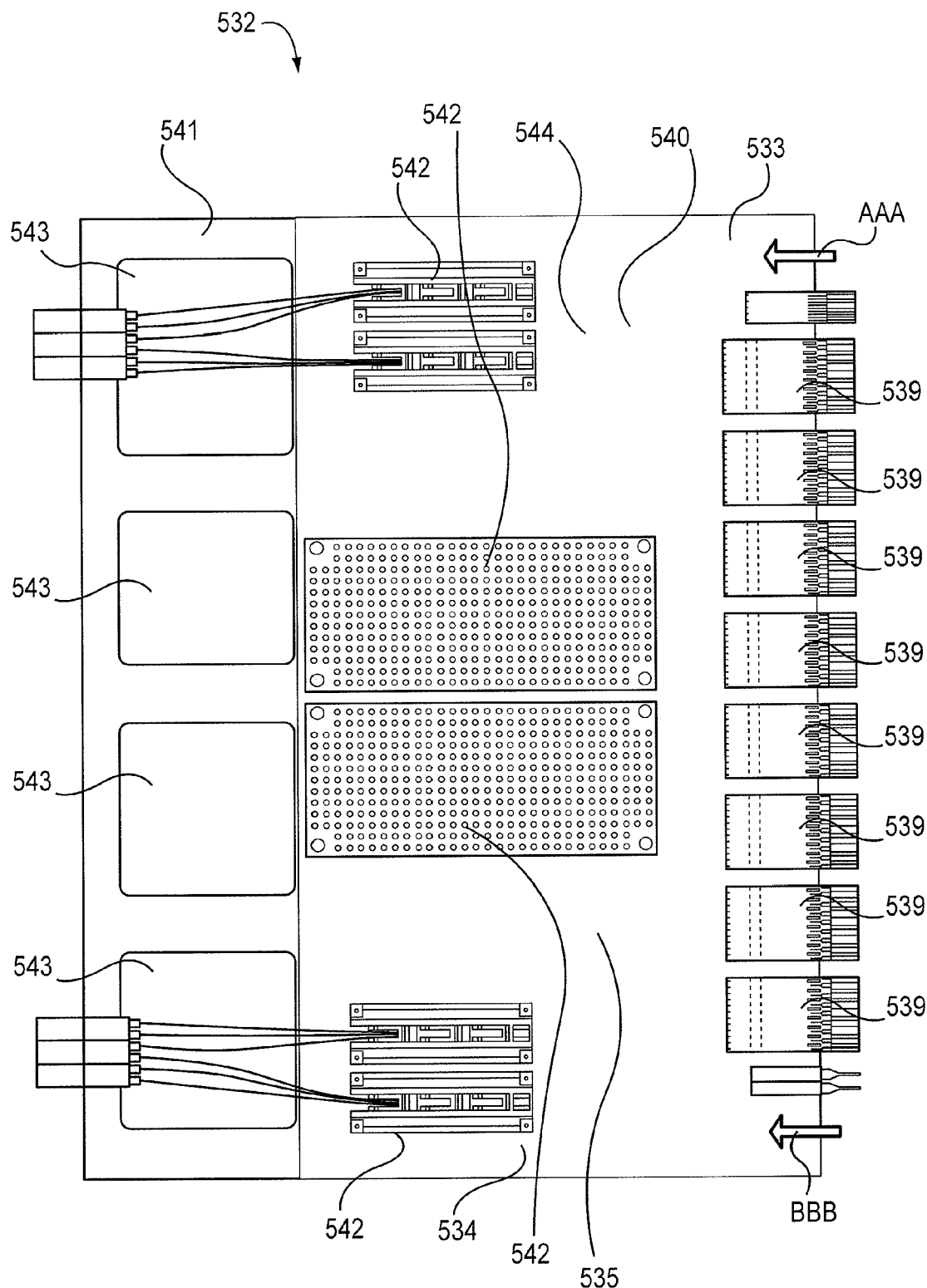
FIG. 11 is a top view of a line card from the data processing unit shown in FIG. 10.

The printed circuit board 540 can be any suitable printed circuit board upon which electrical components (i.e., signal processors, connectors, or the like) can be interconnected. More particularly, as shown in FIG. 11, the printed circuit board 540 includes a surface 544 upon which electrical circuits 542 coupled and/or interconnected to perform the data processing functions of the line card 532. The electrical circuits 542 can be any suitable electrical circuit and/or component, such as, for example, a signal process, an application-specific integrated circuit (ASIC) and/or the like. Moreover, the printed circuit board 540 connectors 539 are configured to couple the line card 532 to the midplane.

As shown in FIG. 11, the support member 541 of each line card 532 defines four openings 543. As shown in FIG. 10, the line cards 532 are disposed within the rear portion 519 of the chassis 510 such that the openings 543 of each line card 532 are substantially aligned with the openings 543 of the adjacent line card 532. In this manner, the line cards 532 and the chassis 510 collectively form a series of exhaust flow pathways 526. Although the exhaust flow pathways 526 are shown as being defined primarily by the line cards 532 (e.g., the openings 543), in other embodiments, the chassis 510 can include one or more baffles, ducts and/or internal structures to define portions of the exhaust flow pathways 526.

As shown in FIG. 10, the rear portion 519 of the chassis 510 includes an upper fan tray 560 and a lower fan tray 562, each including blowers configured to produce an airflow within the chassis 510. Thus, the blowers draw cooling air into the rear portion 519 of the chassis from the first end portion 533 and the second end portion 534 of each line card 532 as shown by the arrows AAA and BBB, respectively, in FIG. 11. In this manner, the cooling air can flow across the surface 444 of each line card 432 from the second end portion 434 towards the exhaust flow pathways 526. Similarly stated, the chassis 410 is configured such that the intake air can flow in a direction substantially parallel to the surface 444 of each printed circuit board 540. After flowing across each line card 532, the blowers draw the exhaust air from the rear portion 519 of the chassis 510 to an exhaust region outside of the chassis 510 via the exhaust flow pathways 526, in a similar manner as described above with reference to the data processing unit 400. More particularly, as described above, the exhaust gas flows within the exhaust flow pathways 526 in a direction substantially orthogonal to the direction of the flow of the intake air. Similarly stated, the exhaust gas flows within the exhaust flow pathways 526 in a direction substantially orthogonal to the surface 544 of the line card 532.

Although shown as being substantially square, the openings 543 can have any suitable size and/or shape. For example, in some embodiments, the openings can be substantially rectangular and/or can have an area between approximately four percent and sixteen percent of the surface area of the line card 532. In other embodiments, the openings can have an area as much as twenty percent of the surface area of the line card 532. In yet other embodiments, the openings 543 can be a series of perforations defined by the support member 541.

While various embodiments have been described above, it should be understood that they have been presented by way of example only, and not limitation. Where methods and/or schematics described above indicate certain events and/or flow patterns occurring in certain order, the ordering of certain events and/or flow patterns may be modified. While the embodiments have been particularly shown and described, it will be understood that various changes in form and details may be made.

For example, although the first internal side wall 420 and the second internal side wall 422 are shown as being substantially planar, in other embodiments, the first internal side wall 420 and the second internal side wall 422 can have any suitable shape. In some embodiments, for example, an internal side wall can have a curved shape.

Although the chassis shown and described above define various flow pathways being identified as intake flow pathways (e.g., the first flow pathway 421 and the second flow pathway 423) and exhaust flow pathways (e.g., the exhaust flow pathway 426), in other embodiments, the direction of gas flow within the chassis can be reversed. For example, although the data processing unit 400 is shown and described as receiving intake air from the front portion 418 of the chassis and producing an exhaust flow proximate the rear portion 419 of the chassis, in other embodiments, a data processing unit can receive intake air from the rear portion of the chassis and produce an exhaust flow proximate the front portion of the chassis.

Although the line card 432 is shown as defining an opening 443 disposed towards the rear portion of the line card 432 (i.e., the portion of the line card 432 opposite the midplane 414), in other embodiments, a line card can define one or more openings at any location of the line card. For example, in some embodiments, a line card can define an opening at portion of the line card proximate the midplane.

Although the line cards are described herein in some embodiments as being configured to process, transmit and/or convey optical signals (e.g., converting an optical signal into an electrical signal), in other embodiments, a line card need not be configured to receive, process, transmit and/or convey optical signals. For example, in some embodiments, a line card (such as, for example, line card 532) can be configured to receive, process, transmit and/or convey electrical signals (i.e., voltage signals, current signals or the like).

Although various embodiments have been described as having particular features and/or combinations of components, other embodiments are possible having a combination of any features and/or components from any of embodiments as discussed above. For example, in some embodiments, a data processing unit can define a flow pathway configured to direct an exhaust flow out of a central portion of the chassis (similar to the flow pathway 226) and a flow pathway configured to direct exhaust flow out of an end portion of the chassis (similar to the flow pathway 326).

What is claimed is:

1. An apparatus, comprising: a plurality of line cards, each line card from the plurality of line cards defining an opening and having a surface; and a chassis to contain the plurality of line cards such that the opening of the each line card from the plurality of line cards collectively defines, at least in part, a first portion of an exhaust flow pathway and a second portion of the exhaust flow pathway, the chassis defining, at least in part, a portion of an intake flow pathway through which a gas can flow across the surface of the each line card from the plurality of line cards in a first direction, the chassis and the plurality of line cards collectively disposed such that a first portion of the gas can flow within the first portion of the exhaust flow pathway in a second direction substantially orthogonal to the first direction and a second portion of the gas can flow within the second portion of the exhaust flow pathway in a third direction, the third direction opposite the second direction.

2. The apparatus of claim 1, wherein: the gas is a first gas; the intake flow pathway is a first intake flow pathway; and the chassis defines, at least in part, a portion of a second intake flow pathway through which a second gas can flow across the surface of the each line card from the plurality of line cards in a fourth direction substantially opposite the first direction.

3. The apparatus of claim 1, wherein: the each line card from the plurality of line cards has a first end portion and a second end portion; the gas is a first gas; the intake flow pathway is a first intake flow pathway between an intake region outside of the chassis and the first end portion of the each line card from the plurality of line cards; and the chassis defines, at least in part, a portion of a second intake flow pathway between the intake region outside of the chassis and the second end portion of the each line card from the plurality of line cards through which a second gas can flow across the surface of the each line card from the plurality of line cards.

4. The apparatus of claim 1, wherein: the gas is a first gas; the intake flow pathway is a first intake flow pathway; the chassis defines, at least in part, a portion of a second intake flow pathway through which a second gas can flow across the surface of the each line card from the plurality of line cards; and the chassis and the plurality of line cards collectively disposed such that a first portion of the second gas can flow within the first portion of the exhaust flow pathway in the second direction and a second portion of the second gas can flow within the second portion of the exhaust flow pathway in the third direction.

5. The apparatus of claim 1, wherein: the each line card from the plurality of line cards includes a central portion disposed between a first end portion and a second end portion, the central portion of the each line card defining the opening of the each line card from the plurality of line cards.

6. The apparatus of claim 1, further comprising:
a midplane disposed within the chassis such that the midplane divides the chassis into a front portion and a rear portion, the plurality of line cards disposed within the rear portion of the chassis,
the chassis and the plurality of line cards collectively disposed such that the gas flows within the intake pathway through the front portion of the chassis in a fourth direction substantially orthogonal to the first direction.

7. The apparatus of claim 1, further comprising:
a first fan tray including at least one fan in fluid communication with the exhaust flow pathway; and
a second fan tray including at least one fan in fluid communication with the exhaust flow path, the plurality of line cards disposed within the chassis between the first fan tray and the second fan tray.

8. An apparatus, comprising:
a chassis defining, at least in part, a portion of an intake flow pathway;
a midplane disposed within the chassis such that the midplane divides the chassis into a front portion and a rear portion;
a first line card disposed within the rear portion of the chassis; and
a second line card disposed within the rear portion of the chassis,
a portion of the first line card, a portion of the second line card and the chassis collectively defining, at least in part, a first portion of an exhaust flow pathway and a second portion of the exhaust flow pathway,
the chassis and the first line card collectively disposed such that a first portion of a gas can flow in a first direction within the first portion of the exhaust flow pathway and a second portion of the gas can flow in a second direction within the second portion of the exhaust flow pathway, the second direction substantially opposite the first direction.

9. The apparatus of claim 8, wherein the first direction and the second direction are each substantially orthogonal to a surface of the first line card.

10. The apparatus of claim 8, wherein
the first line card defines an opening that defines, at least in part, the first portion of the exhaust flow pathway; and
the second line card defines an opening that defines, at least in part, the second portion of the exhaust flow pathway.

11. The apparatus of claim 8, wherein the chassis and the first line card are collectively disposed such that the gas can flow through the intake flow pathway and across a surface of the first line card in a third direction substantially orthogonal to the first direction.

12. The apparatus of claim 8, wherein: the intake flow pathway is a first intake flow pathway; the gas is a first gas; the chassis and the first line card are collectively disposed such that the first gas can flow through the first intake flow pathway and across a surface of the first line card in a third direction substantially orthogonal to the first direction; and the chassis and the first line card are collectively disposed such that a second gas can flow through a second intake flow pathway and across the surface of the first line card in a fourth direction different from the third direction.

13. The apparatus of claim 8, wherein the intake flow pathway is a first intake flow pathway, the gas is a first gas, the chassis and the first line card are collectively disposed such that the first gas can flow through the first intake flow pathway from an intake region to the first line card, the apparatus further comprising: a third line card disposed within the front portion of the chassis, the chassis defining, at least in part, a portion of a second intake flow pathway, the chassis and the third line card are collectively disposed such that a second gas can flow through the second intake flow pathway and across a surface of the third line card in a third direction substantially parallel to the first direction.

14. The apparatus of claim 8, further comprising:
a first fan disposed within the chassis; and
a second fan disposed within the chassis,
the first line card and the second line card each disposed between the first fan and the second fan.

15. An apparatus, comprising: a chassis; a first fan disposed within the chassis; and a second fan disposed within the chassis, the chassis to contain a plurality of first line cards between the first fan and the second fan, the chassis defining, at least in part, a portion of an intake flow pathway through which a gas can flow across a surface of each first line card from the plurality of first line cards in a first direction, the chassis and the plurality of first line cards collectively defining a first portion of an exhaust flow pathway through which a first portion of the gas can flow to the first fan in a second direction substantially orthogonal to the first direction, the chassis and the plurality of first line cards collectively defining a second portion of an exhaust flow pathway through which a second portion of the gas can flow to the second fan in a third direction substantially opposite the second direction.

16. The apparatus of claim 15, further comprising: the each first line card from the plurality of first line cards defining an opening that collectively define, in part, the exhaust flow pathway.

17. The apparatus of claim 15, the gas is a first gas; the intake flow pathway is a first intake flow pathway; and the chassis defines, at least in part, a portion of a second intake flow pathway through which a second gas can flow across the surface of the each line card from the plurality of first line cards in a fourth direction substantially opposite the first direction.

18. The apparatus of claim 15, wherein: the gas is a first gas; the intake flow pathway is a first intake flow pathway between an intake region outside of the chassis and a first end portion of the each line card from the plurality of first line cards; and the chassis defines, at least in part, a portion of a second intake flow pathway between the intake region outside of the chassis and a second end portion of the each first line card from the plurality of first line cards through which a second gas can flow across the surface of the each first line card from the plurality of first line cards.

19. The apparatus of claim 15, further comprising: a midplane disposed within the chassis such that the midplane divides the chassis into a front portion and a rear portion, the plurality of first line cards to be disposed within the rear portion of the chassis, the chassis and the plurality of first line cards collectively disposed such that the gas flows within the intake pathway through the front portion of the chassis in a fourth direction substantially orthogonal to the first direction.

20. The apparatus of claim 15, wherein the intake flow pathway is a first intake flow pathway, the gas is a first gas, the apparatus further comprising: a midplane disposed within the chassis such that the midplane divides the chassis into a front portion and a rear portion, the plurality of first line cards configured to be disposed within the rear portion of the chassis, a plurality of second line cards configured to be disposed within the front portion of the chassis, the chassis defining, at least in part, a portion of a second intake flow pathway through which a second gas can flow across a surface of each second line card from the plurality of second line cards in a fourth direction substantially parallel to the second direction.

* * * * *